United States Patent
Miller et al.

(10) Patent No.: US 6,354,370 B1
(45) Date of Patent: Mar. 12, 2002

(54) LIQUID SPRAY PHASE-CHANGE COOLING OF LASER DEVICES

(75) Inventors: Harold C. Miller; Kenneth M. Dinndorf, both of Albuquerque, NM (US); Bartley D. Stewart, Winchester, TN (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/465,021

(22) Filed: Dec. 16, 1999

(51) Int. Cl.[7] .......................... F25B 29/00; G05D 23/00
(52) U.S. Cl. ................ 165/263; 165/80.4; 165/287; 62/223; 62/259.2; 62/259.4; 62/DIG. 10; 62/DIG. 22; 174/16.3; 257/714; 313/35; 361/700
(58) Field of Search ................ 165/287, 263, 165/299, 80.4, 80.5, 97; 62/121, 189, 216, 222, 223, 259.2, 259.4, 304, 314, DIG. 10, DIG. 22; 174/15.1, 16.1, 16.3; 257/712, 714, 716, 717, 720, 721, 930; 361/688, 689, 699, 700, 702

(56) References Cited

U.S. PATENT DOCUMENTS

| | | | | |
|---|---|---|---|---|
| 2,466,769 A | * | 4/1949 | Herold et al. | 165/263 |
| 2,508,988 A | * | 5/1950 | Bradley | 165/263 |
| 2,787,443 A | * | 4/1957 | Meagher et al. | 165/263 |
| 3,932,029 A | * | 1/1976 | Weiss | |
| 4,095,644 A | * | 6/1978 | Huff | 165/299 |
| 4,141,224 A | * | 2/1979 | Alger et al. | 313/35 X |
| 4,283,686 A | * | 8/1981 | Daugherty et al. | |
| 4,338,577 A | * | 7/1982 | Sato et al. | |
| 4,431,269 A | * | 2/1984 | Barnes, Jr. | |
| 4,627,244 A | * | 12/1986 | Willhoft | 62/216 X |
| 4,883,115 A | * | 11/1989 | Johanson et al. | 165/299 |
| 4,897,762 A | * | 1/1990 | Daikoku et al. | 165/80.4 X |
| 5,249,358 A | * | 10/1993 | Tousignant et al. | |
| 5,263,536 A | * | 11/1993 | Hulburd et al. | 165/80.4 |
| 5,412,536 A | * | 5/1995 | Anderson et al. | 165/80.5 X |
| 5,453,641 A | * | 9/1995 | Mundinger et al. | |
| 5,476,137 A | * | 12/1995 | Ochiai et al. | 165/263 X |
| 5,777,384 A | * | 7/1998 | Root et al. | |
| 5,907,473 A | * | 5/1999 | Przilas et al. | 165/80.4 X |
| 5,941,083 A | * | 8/1999 | Sada et al. | 165/263 X |
| 5,960,857 A | * | 10/1999 | Oswalt et al. | 165/263 X |
| 6,108,201 A | * | 8/2000 | Tilton et al. | 165/80.4 X |
| 6,205,799 B1 | * | 3/2001 | Patel et al. | |

FOREIGN PATENT DOCUMENTS

EP         0 349 511 A2 *  1/1990  ................ 62/259.2

OTHER PUBLICATIONS

R. Tillner–Roth and H. D. Baehr, J. Phys. Chem. Ref. Data. 23, p. 657 (1994).

* cited by examiner

Primary Examiner—Ljiljana Ciric
(74) Attorney, Agent, or Firm—Kenneth E. Callahan

(57) ABSTRACT

An open loop liquid spray phase-change cooling system for a laser comprised of an expendable supply of a compressed liquid refrigerant, a laser heat sink, an on/off valve, and a means for controlling the on/off valve in response to the measured heat sink temperature.

1 Claim, 1 Drawing Sheet

LIQUID SPRAY PHASE-CHANGE COOLING OF LASER DEVICES

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

1. Field of the Invention

The present invention is in the field of electronic component cooling, and in particular relates to the application of liquid spray phase-change cooling technology to remove excess heat from laser systems.

2. Description of the Prior Art

Most commercial laser systems use heat exchangers or chillers to remove excess heat. Usually, water or some other coolant flows across the heated regions, taking up heat, which is moved and dissipated in a heat exchanger or large tank. Some systems simply use a flow of city water through a laser head, then into a drain. Flow rates of greater than 10 gallons per minute are not uncommon. Liquid flow systems offer high heat removal capacities and are therefore very useful, if not essential, in lasers that generate a large amount of waste heat. Liquid coolers are usually quite large and use a significant amount of electrical power, and are therefore not easily portable. They also offer only a limited accessible temperature range and rather slow temporal response due to the physical properties of the fluid (viscosity, freezing points, etc.) and the typically large thermal masses of the reservoir.

Other laser systems use convective airflow over a heat sink (probably finned) attached to the excess heat source. This type of cooling is desirable and efficient when practical, since the power to drive a fan(s) may be all that is required. Because airflow cooling is typically less effective at removing heat than other methods, the technique works best in smaller lasers that do not dissipate much heat or require precise temperature control.

When better temperature control or low temperature operation is needed, thermoelectric (TEC) or other electrically driven coolers are often used to control the rate of heat removal, and therefore the temperature. However, the amount of power required to drive the electric cooler often exceeds that required to power the laser device, thereby lowering the overall system efficiency and increasing the demands on heat removal. Furthermore, electric chillers used to drive materials to low temperatures usually have limited capacity, and are therefore not usually used in higher heat load laser devices.

Another cooling method used in lasers is direct impingement cooling where the excess heat source in the laser is connected to a heat pipe or cold finger that is in thermal contact with a cold bath like liquid nitrogen. The heat flows into the cold bath and is eventually released as an increase in the vaporization rate. This can be a very efficient means of removing heat and cooling a laser device, with a similar heat removal capacity per volume as the liquid spray approach. However, the operating temperature is essentially fixed at the boiling point. Also, special cryogenic equipment and a supply of fluid are necessary for operation.

The waste heat removal system of U.S. Pat. No. 5,453,641 involves a coolant passing through a surface in thermal contact with a heated region via microchannels that induce capillary C action. The coolant vaporizes outside the microchannels for additional cooling. This system is effective but complex.

The proposed liquid spray phase-change cooling technology of the present invention provides an alternative way to remove excess heat from laser systems and to provide rapid cooling and stable temperature control over a wide range of temperatures. The invention could be particularly useful in laser applications where portability and electrical power consumption are at a premium, especially in applications where the laser run time is inherently limited. Examples could be man or vehicle carried laser systems for illumination, remote sensing, ranging, free-space communications, mobile satellite uplinks, or directed energy weapons. In addition, the technology could be used to efficiently cool laser materials (like laser diodes or three level solid state media) that perform better at low temperatures.

SUMMARY OF THE INVENTION

The surface to be cooled is connected to the excess heat source of a laser. A liquid coolant is sprayed onto the surface via a valve with rapid on/off response times. The valve is driven by a control signal in response to a temperature sensor. The surface temperature is thereby controlled by varying the spray duration and frequency. The coolant vaporizes at the surface and is either vented to the atmosphere or recirculated through a compressor and reliquefied.

DESCRIPTION OF THE PREFERRED EMBODIMENT

Figure 1:
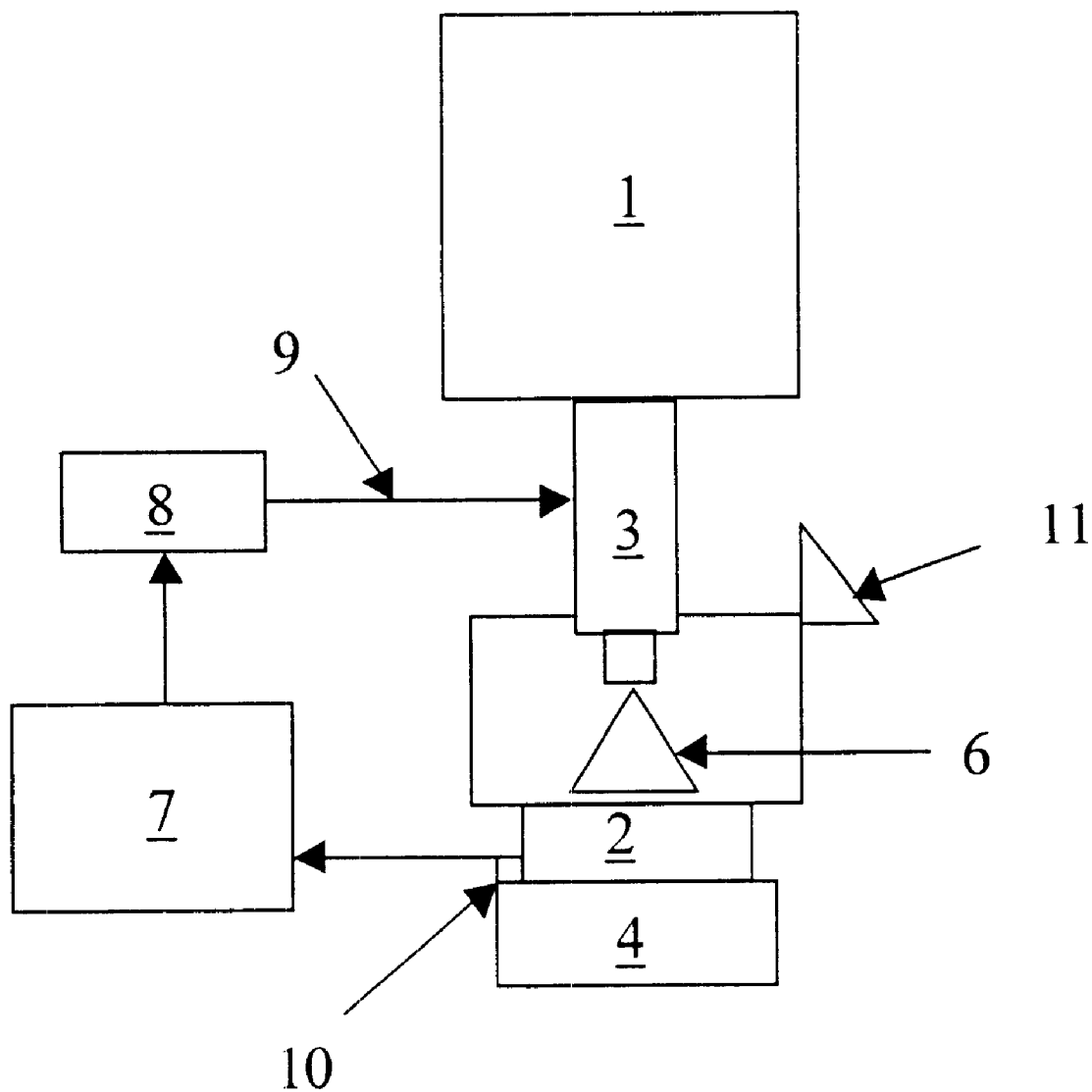
FIG. 1 is a schematic of the liquid spray phase-change cooler.

A schematic of the basic liquid-spray phase-change cooling system for lasers is shown in FIG. 1. The compressed liquid is contained in a can or vessel 1. The liquid is delivered to a surface (heat sink) 2 to be cooled through a high quality valve 3, capable of delivering a sufficiently uniform spray 6 to the surface with fast on/off response times. The cooled surface is connected to the excess heat source of a laser 4 or other electronic component producing waste heat. The valve is driven by the control signal from a temperature controller 7, possibly using a relay 8 to route the required electrical signal 9 to drive the valve. The temperature controller senses the surface temperature by way of a standard sensor 10, such as a thermocouple or a thermistor. The controller in the preferred embodiment is operated in an on/off control mode as opposed to a proportional mode, so that the spray duration and frequency are controlled. The exhaust vapor 11 produced by the boiling liquid can simply be vented to the atmosphere, or alternatively be recirculated through a compressor and reliquefied. The evolving vapor can as well be used to convectively cool another part of the laser system or to purge parts that may be susceptible to condensation or dust.

The choice of coolant liquid is governed by several factors. These include the desired operating temperature and pressure, the latent heat of vaporization of the liquid, and other factors such as chemical toxicity (environmental and physical), flammability, corrosiveness, cost, and recompressibility. For portable lasers, we focused on off-the-shelf refrigerants that are inexpensive and can safely be vented to the atmosphere. Many other organic and inorganic substances could also be used to cool lasers.

For example, the present invention could be implemented using the environmentally acceptable refrigerant R134a (1,1,1,2-tetra flouroethane) commonly used in modern automotive air conditioners. This compound is in a class of compound called hydrofluorocarbons (HFC), which are becoming acceptable replacements for the ozone-depleting chloroflourocarbon (CFC) and hydroclorofluorocarbon (HCFC) refrigerants. Several of the known HFC's or blends could be used as spray coolants in laser systems. A few of the important chemical and physical properties of R134a are given in Table 1.

TABLE 1

Chemical and physical properties of R134a

| Formula | $T_b$ | $P_s$ | $\rho$ | $h_s$ | $h_g$ |
|---|---|---|---|---|---|
| C2H4F4 | 246.8 | 0.703 | 1199.6 | 237.2 | 426.1 | where $T_b$ is the boiling point (K); $P_s$ is the saturated gas vapor pressure [MPa] at 300K; $\rho$ is the liquid density [kg/m$^3$] at 300K; $h_s$ is the enthalpy [J/g] of the saturated vapor at 300K; and $h_g$ is the enthalpy [J/g] of the gas at 300K (R. Tillner-Roth and H. D. Baehr, J. Phys. Chem. Ref. Data. 23, p. 657 (1994)).

Using the change in enthalpy between the liquid and gas phases we can calculate the maximum amount of heat that can be removed per gram of coolant (~188 J/g). Only a small fraction (<1%) of the energy in the compressed liquid is stored as potential energy (PV). As the sprayed surface becomes cooler, the evolving vapor will also be cooler, and slightly less heat removal will occur. However, even at temperatures just slightly above boiling, greater than ¾ of the spray cooling capacity remains available.

Liquid spray phase-change cooling devices have some compelling features that should prove to be useful for certain applications. The invention offers a definite savings in electrical power consumption over conventional coolers, especially is cases where direct airflow cooling is impractical due, for example, to the need for low operating temperatures or accurate temperature control.

The volume occupied by the cooler is significantly less than other cooling systems with similar capacity, improving the overall portability of, for example, a laser system. Low operating temperatures can be reached very quickly without increasing the power drawn from the cooler. This shortens the effective laser turn-on time and increases efficiency. The accessible temperature range can be large, with the minimum achievable temperature being essentially the boiling point of the liquid. Only the materials of construction should limit the maximum temperature. The active surface area for cooling can be small so localized cooling of tiny, light, heat sources can be achieved. Other coolers typically require larger accessible surface areas, especially as the heat removal requirements increase. Large heat sinks or heat spreaders negatively impact the response time and compactness of the device.

Unlike TEC's or convective air flow coolers, very large amounts of heat can in principle, be removed by the liquid spray phase-change technique simply by increasing the spray volume, albeit at the expense of proportional quantities of coolant. The technique has a definite advantage for laser systems that use gain media that perform better at temperatures significantly below ambient, especially in applications where cryogenic fluid-based devices are not practical. The gas produced in the boiling process can be used to cool other parts of the laser system or to purge optical surfaces of dust or atmospheric condensation.

There are a number of possible variations to the basic cooling system. Efficient closed-cycle refrigerators could be built around the heat sink so that the residual vapors would be recompressed and liquefied rather than vented to the atmosphere. Replaceable containers of compressed liquid could be used such that empty containers could be replaced with no interruption in run time.

Adjustable-volume spray valves and proportional temperature control could be used, so that a constant heat removal rate can be achieved. This could be useful in applications where the thermal mass of the heat source is very small and on/off cooling introduces unacceptable temperature excursions.

If the vaporization region was enclosed in a vessel and the coolant was sprayed at a constant rate, an exhaust valve or calibrated exhaust orifice could be used to adjust the steady state pressure in the vessel. In such an arrangement, the boiling temperature of the fluid could be set to a value higher than it is at atmospheric pressure, thereby providing an alternative way to adjust the minimum obtainable temperature of the cold surface. This control technique might be useful in larger heat load systems demanding fast high volume sprays.

We claim:

1. An open loop liquid spray phase-change cooling system for a laser comprised of:

a heat sink disposed in heat transfer relation relative to a laser to be cooled;

an expendable supply of compressed liquid refrigerant;

an on/off valve connected to said supply of compressed liquid refrigerant and positioned with respect to said heat sink to deliver a uniform spray of said liquid refrigerant onto said heat sink whereupon said refrigerant vaporizes and is vented to the atmosphere;

means for measuring the temperature of said heat sink; and means for controlling said on/off valve in response to the measured heat sink temperature.

* * * * *